United States Patent [19]

Sanielevici

[11] Patent Number: 4,873,457
[45] Date of Patent: Oct. 10, 1989

[54] INTEGRATED SAMPLE AND HOLD CIRCUIT

[75] Inventor: Sergio A. Sanielevici, Portland, Oreg.

[73] Assignee: Tektronix, Inc., Beaverton, Oreg.

[21] Appl. No.: 214,973

[22] Filed: Jul. 5, 1988

[51] Int. Cl.[4] ............................................. G11C 27/02
[52] U.S. Cl. .................................... 307/353; 307/491; 328/151
[58] Field of Search ........................ 307/353, 494, 491; 328/151

[56] References Cited

U.S. PATENT DOCUMENTS

| | | | |
|---|---|---|---|
| 3,286,101 | 11/1966 | Simon | 307/353 |
| 3,643,110 | 2/1972 | Thompson | 307/353 |
| 3,820,033 | 6/1974 | Iwata | 307/353 |
| 4,198,541 | 4/1980 | Fukushima | 307/353 |
| 4,542,305 | 9/1985 | Blauschild | 307/353 |
| 4,584,559 | 4/1986 | Penney | 307/353 |
| 4,636,659 | 1/1987 | Sugimoto | 307/353 |

FOREIGN PATENT DOCUMENTS

| 0206999 | 9/1986 | Japan | 307/353 |
|---|---|---|---|
| 0270100 | 11/1987 | Japan | 307/353 |

Primary Examiner—John Zazworsky
Attorney, Agent, or Firm—Edward B. Anderson; Robert S. Hulse

[57] ABSTRACT

A sample and hold circuit made entirely of NPN transistors, capacitors and resistors uses double emitter-follower transistors for gating an input signal onto a charging capacitor. A transistor connected in parallel to the first of the emitter-follower transistors is controlled to conduct blow-by current away from the second emitter-follower transistor in the hold state. A step voltage is applied to the charge capacitor in the hold state to prevent turn on of the emitter-follower transistors. The circuit is configured with complementary components so that a differential output signal eliminating the step voltage is provided.

9 Claims, 3 Drawing Sheets

INTEGRATED SAMPLE AND HOLD CIRCUIT

FIELD OF THE INVENTION

This invention relates to sample and hold circuits, and in particular, to such circuits which can be constructed using high speed integrated circuit techniques.

BACKGROUND OF THE INVENTION

Sample and hold circuits typically employ switching device for periodically connecting a capacitor to an input signal to be sampled so that while the capacitor is connected to the signal it charges and discharges to track the voltage level of the signal. After the switch disconnects the capacitor from the input signal, the capacitor holds that voltage level existing at the time it is disconnected.

The capacitor is also typically connected to a high impedance input of a buffer amplifier which provides the hold output signal of the sample and hold circuit, the high impedance input ensuring minimal discharge of the capacitor during the hold phase of the circuit operation.

See U. S. Pat. No. 4,584,559 issued April 22, 1986 to Penney for discussion of a sample and hold circuit used to eliminate glitches on the output of a digital-to-analog converter. Sample and hold circuits are also often used on the input of an analog-to-digital converter for providing a stable input signal for the converter.

The switches used in sample and hold circuits are typically either Schottky diode bridges or field-effect transistors. For an example of an elaborate sample and hold circuit using the latter type of switching device, see U. S. Pat. No. 3,820,033 issued June 25, 1974 to Iwata.

Such prior devices may generally be made simply and are effective for high speed applications. However, they cannot be produced using high speed bipolar integrated circuit processes. Conventional sample and hold circuits cannot be made with bipolar transistors, particularly NPN transistors, because they require longer settling times during switching. Thus, they typically are inadequate for high speed applications.

SUMMARY OF THE INVENTION

The present invention overcomes this inherent inapplicability of bipolar semiconductor devices by providing a high speed sample and hold circuit comprising bipolar semiconductor and associated devices which may be made using integrated circuit techniques. In the preferred embodiment of the invention, such a circuit is provided composed only of NPN transistors as active components, plus resistors and capacitors.

This is made possible by a sample and hold circuit comprising a first bipolar transistor means having a base coupled to receive an input signal. A capacitor is coupled to the transistor for storing a voltage representative of the input signal while the transistor is turned on, and for storing a voltage representative of the input signal at the time the transistor is turned off while the transistor is turned off. Means is also provided for biasing selectively the transistor appropriately for turning it on and off.

Means is also preferably provided for applying selectively relatively higher and lower voltages on the capacitor. Means for controlling the transistor biasing and the capacitor voltage is provided such that when the transistor is biased to turn off, the relatively higher voltage is applied to the capacitor. The capacitor then carries a voltage representative of the input signal existing when the transistor is turned off plus the higher voltage. This assures that the transistor will not turn back on while the circuit is in the hold state.

In the preferred embodiment of a sample and hold circuit made according to the present invention, a pair of input terminals receives a differential input signal. A pair of output terminals transmit a differential output signal. A control signal generator generates a pair of complementary control signals having a first state during which the voltage of the input signal existing when the control signal assumes the first state is held on the output terminals. A first and second capacitor are coupled together and to the output terminals for storing respective complementary voltages on the output terminals. First and second pairs of double emitter follower bipolar transistor pairs are each coupled between a respective one of the input terminals and a corresponding one of the capacitors. The base of one of the transistors in each of the transistor pairs is coupled to a respective one of the input terminals. The emitter of the other one of the transistors, serving as the gate transistors, in each of the transistor pairs is coupled to a respective one of the capacitors.

Fifth and sixth bipolar transistors are each coupled in parallel, respectively, with the one transistor of the first and second transistor pairs. Separate current sources are coupled to the junction between the first and second capacitors, to the one transistor of each of the pairs of transistors, and to the other transistor of each of the pairs of transistors. Separate switches are posed in series with each of the respective current sources associated with the junction between the first and second capacitors, and the other transistor of each of the pairs of transistors. The switches are formed of bipolar transistors. The switches associated with the other of the transistor pairs are coupled to receive respective ones of the complementary control signals. The switch associated with the junction between the capacitors is coupled to receive a corresponding one of the control signals such that the voltages on the capacitors track the input signal when the control signal is in a state other than the first state. The voltage across both of the capacitors is held at the voltage existing when the control signal changes to the first state while the control signal is at the first state.

The present invention thus provides a sample and hold circuit which may be constructed using high speed bipolar integrated circuit processes. Particularly in the preferred embodiment, the circuit provides a stable hold voltage by the use of a transistor parallel to the input transistor of the double emitter-follower transistors to conduct the capacitive input currents. Further, discreet switching by the gate transistor associated with each storage capacitor is assured by applying a positive voltage to the capacitor during the hold state of the circuit. This added voltage is eliminated at the output by taking as the output signal the differential signal across the complementary capacitors. This may be reduced to a single output signal by a differential amplifier providing common mode rejection.

These and other features and advantages of the present invention will become apparent from the following detailed description of the preferred embodiment in association with the accompanying drawings.

DETAILED DESCRIPTION OF THE PREFERRED EMBODIMENT

Figure 1:
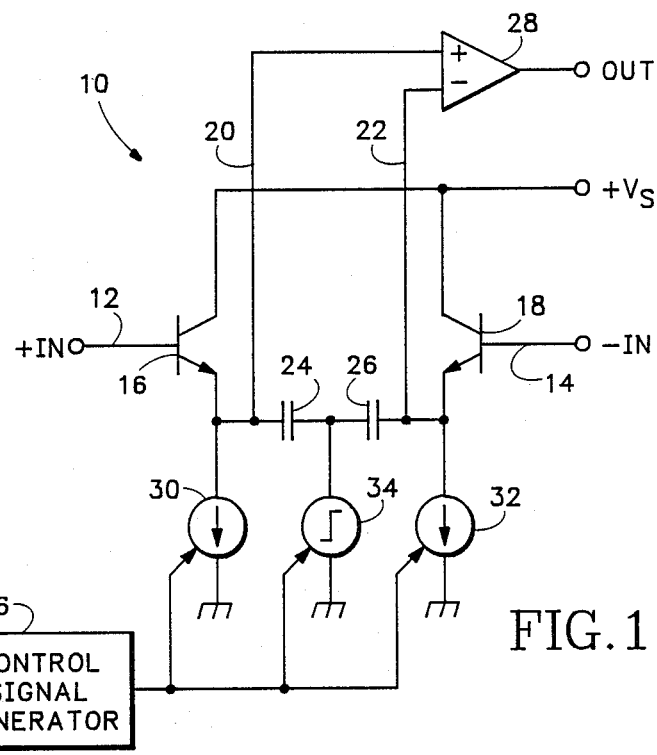
FIG. 1 is a general schematic of a basic sample and hold circuit made according to the present invention.

Referring initially to FIG. 1, a basic sample and hold circuit 10 made according to the present invention is shown. Circuit 10 includes a pair of complementary input terminals 12 and 14 for receiving a differential input signal. This circuit could be structured to have a single input, but, as will be seen, some means other than the use of complementary signals would be required to separate the portion of the output signal not representative of the input signal. Complementary circuitry provides a simple way to accomplish this result.

Various circuits exist which can convert a single signal input into a differential input, if a differential input is not available. An example would be to connect the input to a differential amplifier which produces complementary outputs. The input not coupled to the single input signal is then coupled to a reference voltage to obtain the resulting signal to which the single input signal is related.

Each input terminal 12 and 14 is connected to the base of an emitter-follower bipolar NPN transistor 16 and 18, respectively. The emitters of these transistors are connected via conductors 20 and 22, respectively, to charging capacitors 24 and 26; to corresponding inverting and noninverting inputs of an output amplifier 28; and to controllable current sources 30 and 32. The collectors of the transistors are coupled to a positive voltage supply $V_s$.

The junction between capacitors 24 and 26 is coupled to a controllable voltage signal generator 34 which is operable for producing a lower voltage and a higher voltage. Sources 30 and 32 and generator 34 are controlled by a control signal generated by a control signal generator 36. This generator produces the signals resulting in the tracking state and sampling or hold state of operation.

In the tracking state of operation, current sources 30 and 32 are conducting and connected to the respective transistors 16 and 18. Voltage generator 34 applies a low voltage to the capacitors. In this state, voltages occurring on input terminals 12 and 14 are applied to capacitors 24 and 26. In order to change to the hold state, the current sources are disconnected from the transistors and a positive voltage is applied by generator 34 to the junction between capacitors 24 and 26.

The voltage applied to the capacitor junction is preferably sufficient to maintain the base-emitter voltage of the transistors in a reverse-biased condition regardless of the values of the input signal voltage on the transistors. This voltage should be sufficient to maintain a reverse bias when a minimum voltage is stored on the capacitor and a maximum voltage is received at the input. The higher voltage must therefore be at least equal to the difference between the maximum and minimum input voltages.

The differential output signal, which includes the voltage from the input signal plus the higher voltage applied by generator 34, is input to amplifier 38. Amplifier 38 is preferably chosen to have a high common mode rejection ratio. This assures that the higher voltage, which appears on both of conductors 20 and 22, is eliminated from the signal output by the amplifier. The differential signal on conductors 20 and 22 may also be directly input into any complementary circuitry, which inherently rejects common mode signals.

Figure 2:
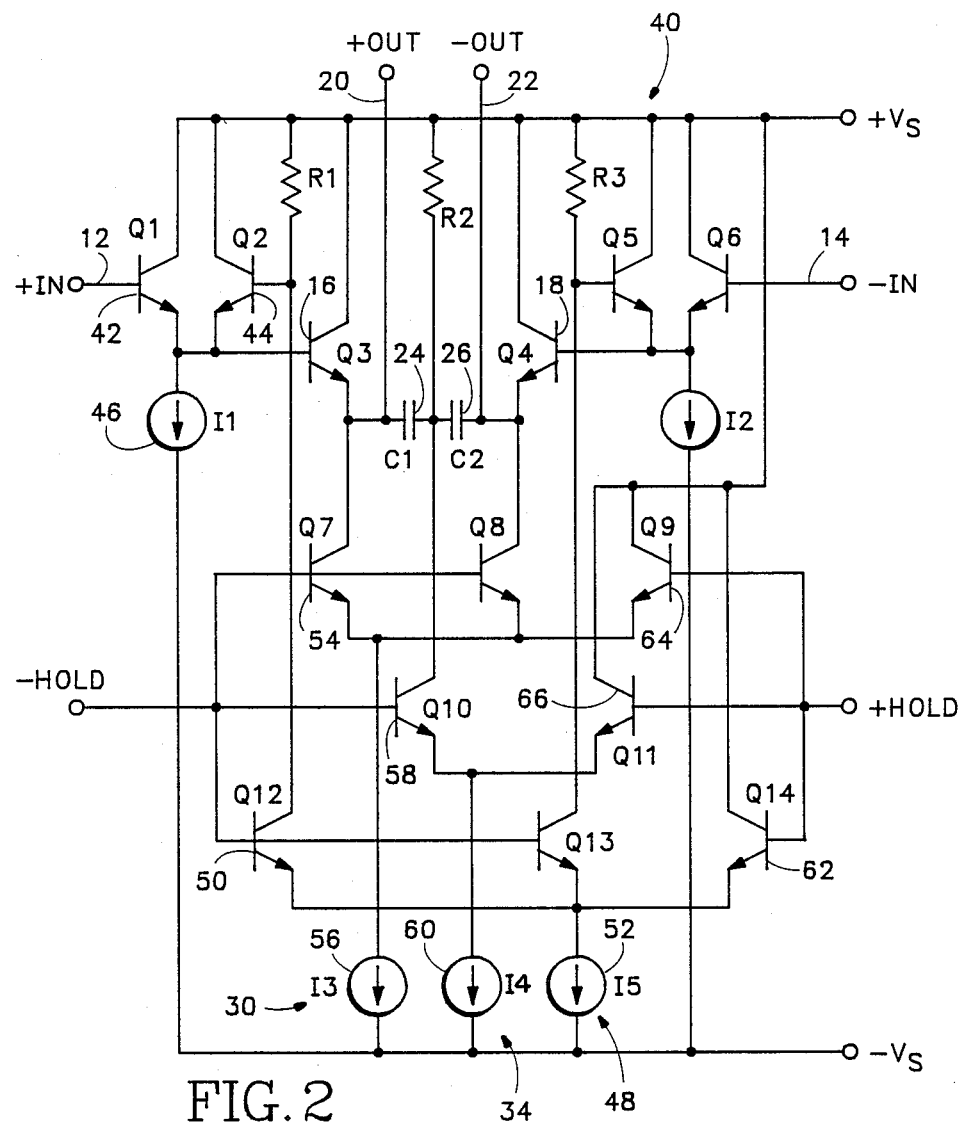
FIG. 2 is a further detailed schematic of a portion of the circuit of FIG. 1.

Referring now to FIG. 2, a further detailed sample and hold circuit 40 made according to the present invention is shown. Components which are the same as, or equivalent to the components listed in FIG. 1 are given the same reference number. Except as otherwise noted, since circuit 40 has complementary components, only those associated with input terminal 12 and output terminal or conductor 20 will be described. The explanation is also directly applicable to the corresponding complementary circuitry associated with input terminal 14 and output terminal or conductor 22.

Input terminal 12 is coupled to gate transistor 16 (Q3) via a second emitter-follower transistor 42 (Q1). Connected in parallel to transistor 42 is a transistor 44 (Q2). It is connected in parallel in effect by the connection of the respective collectors and emitters. These transistor emitters are also coupled to a nonswitched current source 46 (I1). The base of transistor 44 is coupled to a switched current source shown generally at 48. Source 48, as regards transistor 44, comprises a switch transistor 50 (Q12) and current source 52 (I5).

Controllable current source 30 comprises a switch transistor 54 (Q7) and a current source 56 (I3). Controllable current source 34 comprises a switch transistor 58 (Q10) and a current source 60 (I4). The bases of transistors 50, 54 and 58 are all connected to the—HOLD terminal of control generator 36.

During the tracking state of operation, the—HOLD signal is high, causing transistors 50, 54 and 58 to conduct. This lowers the base of transistor 44, preventing it from conducting. Transistors 42 and 16 do conduct and a low voltage appears as the floating reference on the junction between capacitors 24 (C1) and 26 (C2). The input voltage therefore appears on the capacitors.

When the control voltage from generator 36 switches to a hold level, transistor 54 turns off, thus leaving the emitter of transistor 16 floating. Transistors 50 and 58 also turn off. The reference voltage on capacitor 24 receives a voltage step, as does the base of transistor 44. The voltage step occurring on the capacitor is larger than that received on the base of transistor 44. This will be true so long as ($\frac{1}{2} \times I5 \times R2$) is less than ($I4 \times R2$). As mentioned, these voltages are appropriate for maintaining transistors 42 and 16 in an off state for any valid input voltage or output held voltage.

Thus the output held voltage includes a positive step or fixed voltage which is added to the sampled input voltage existing when the change to the hold state occurs. Since the circuit is a differential circuit, the same positive step voltage is applied to both outputs. An amplifier, such as amplifier 28 of FIG. 1, having an effective common mode rejection ratio can be used to remove it.

This embodiment has a further advantage of providing blow-by reduction. Blow-by is the capacitive current which flows to the capacitor when the circuit is in a hold state. In the present circuit, the capacitive current generated in the base-emitter capacitance of transistor 42 by the input signal is diverted through transistor 44 to the power supply, $V_s$. This results in a lower voltage on the emitter of transistor 42. In turn, a low capacitive current is conducted through the base-emitter junction of transistor 16. This current is much lower than if the input signal was applied directly to the base of transistor 16, such as in circuit 10 of FIG. 1.

Each of the switched current sources 52, 56 and 60 have alternate current paths when switch transistors 50, 54 and 58 are turned off. These are provided by transistors 62 (Q14), 64 (Q9) and 66 (Q11). When the circuit is in the tracking state, the transistors are biased off. When the circuit is in the holding state, these transistors are biased on, thereby opening the alternate current paths. Switching of the transistors on and off does not alter the current flow with the power supply, thereby reducing the noise that would otherwise result.

Figure 3:
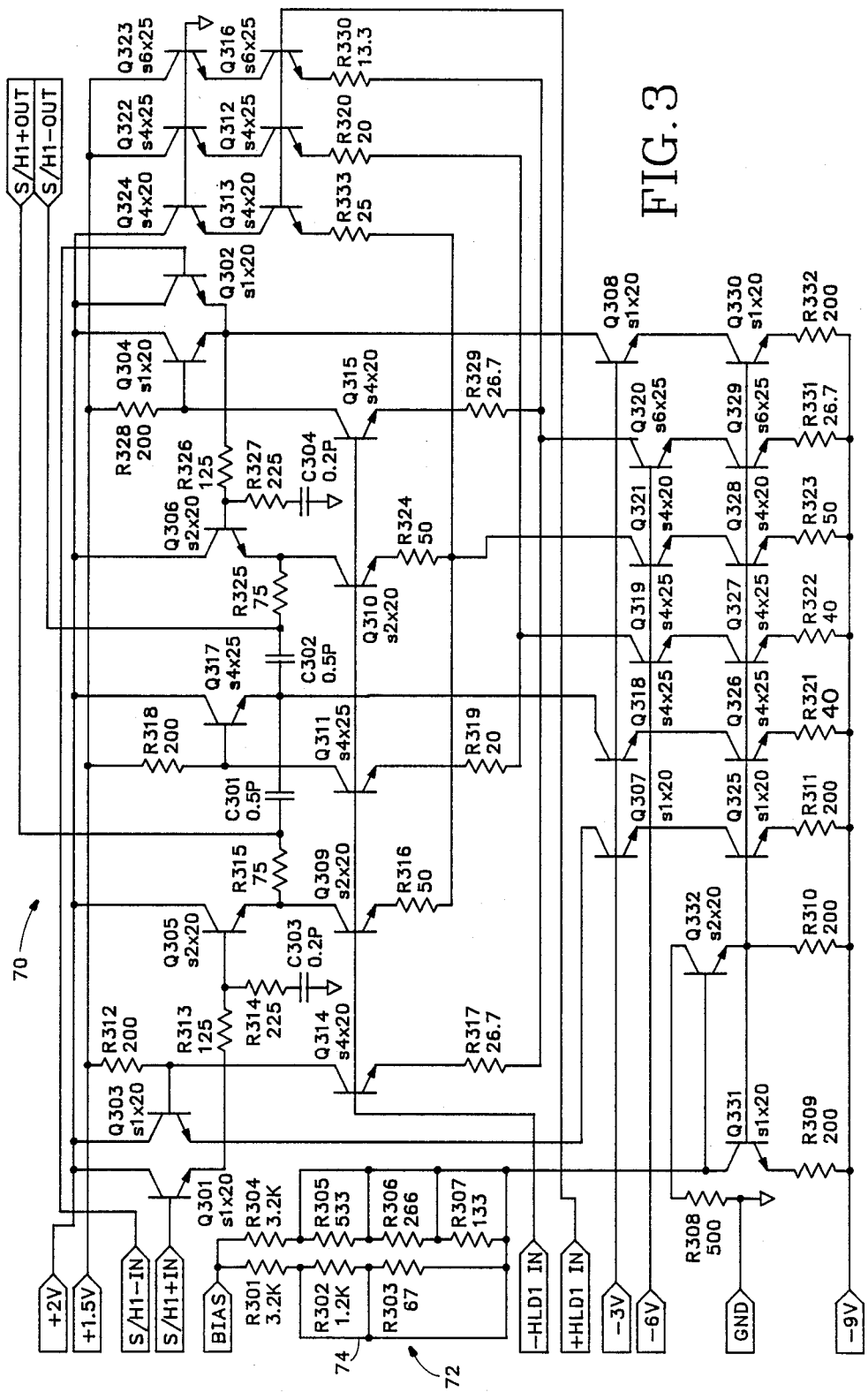
FIG. 3 is a detailed schematic incorporating the circuit of FIG. 2 to form the preferred embodiment of the invention.

A detailed schematic of a circuit 70 made according to the present invention is shown in FIG. 3. This circuit is designed for construction using high speed integrated circuit processes and is composed only of NPN transistors, capacitors and resistors. The figure does not show the control signal generator or an output amplifier as shown in FIG. 1. These components are also preferably provided to form a complete sample and hold module. There structure depends on the particular application in which the circuit is being used.

In FIG. 3, new component numbers and values are listed as shown. Circuit 70 again includes complementary components so only half will be described. Included are double emitter-follower NPN transistors Q301 and Q305. A capacitor C301 is used to track and hold the input voltage values as discussed previously. A transistor Q303 is connected in parallel to transistor Q301 with the base bias controlled by a switched current source formed of transistors Q314 (coupled to receive the control signal), Q320 and Q329, and resistors R312, R317 and R331. A current source formed of transistors Q307 and Q325 and resistor R311 drives transistors Q301 and Q303.

The floating voltage reference on capacitor C301 is provided through the switched biasing of an emitter follower transistor Q317. Biasing is provided through the voltage controlling network of resistor R318, switched transistor Q311, resistor 319, transistors Q319 and Q327, and resistor R322. The switched current source for transistor Q305 is provided through switched transistor Q309, resistor R316, transistors Q321 and Q328, and resistor 323. Alternate current paths also are provided for each of the current sources as described with reference to circuit 40 of FIG. 2.

The additional circuitry shown provides appropriate component biasing or filtering of the input signal. In particular, a bias impedance network, shown generally at 72 provides for tweaking the circuit after it is manufactured. Without trimming, the circuit provides an impedance of 1.6K ohms. Laser trimming can then be used to increase this resistance by cutting selected ones of the conductors, such as conductor 74, which otherwise short out the associated resistor.

It can be seen that the sample and hold circuit of FIG. 3, and therefore of FIGS. 1 and 2, is made entirely of components that can be made using high speed integrated circuit techniques, in that it is composed entirely of NPN transistors as active elements, and resistors and capacitors. Further, this circuit may be operated at high speeds since the capacitor tracks directly the input voltage, has a fast charge rate provided by a small time constant in the charging circuit, and provides fast transition into the hold state from the tracking state due to the gate transistors operating in unsaturated states. The transistors also provide the necessary high isolation impedance in the hold state.

Although the present invention has been described generally and specifically with respect to a preferred embodiment for practicing the invention, it will be understood by those skilled in the art that other forms and details may be used without parting from the spirit and scope of the invention as defined in the claims.

I claim:

1. A sample and hold circuit comprising:
   bipolar transistor means having a base coupled to receive an input signal;
   capacitor means coupled to said transistor means for storing a voltage representative of the input signal while said transistor means is turned on, and for storing a voltage representative of the input signal at the time said transistor means is turned off while said transistor means is turned off;
   current source means for biasing selectively said transistor means appropriately for turning it on and off; and
   means for applying selectively relatively higher and lower voltages on said capacitor means, and means for controlling said current source means and said voltage applying means such that when said transistor means is biased off the relatively higher voltage is applied to said capacitor means, whereby said capacitor means carries a voltage representative of the input signal when said transistor means was turned off plus the higher voltage.

2. A circuit according to claim 1 further comprising means for generating an output signal representative of the voltage on said capacitor means less the higher voltage.

3. A circuit according to claim 2 wherein said output signal generating means comprises complementary circuit means coupled to receive the input signal for producing, in combination with said transistor means, capacitor means and current source means, a differential signal representative of the voltage on said capacitor means.

4. A circuit according to claim 3 wherein said output signal generating means further comprises differential amplifier means coupled to the differential signal for generating the output signal.

5. A sample and hold circuit comprising:
   first bipolar transistor means connected in an emitter-follower configuration with a base coupled to receive an input signal, wherein the input signal produces a capacitive current through said first transistor means when said first transistor means is turned off;
   capacitor means coupled to said transistor means for storing a voltage representative of the input signal while said first transistor means is turned on, and for storing a voltage representative of the input signal at the time said first transistor means is turned off while said first transistor means is turned off;
   first current source means for biasing selectively said first transistor means appropriately for turning it on and off;
   second bipolar transistor means also coupled in an emitter-follower configuration with the base coupled to receive the input signal and the base of said first transistor means being coupled through said second transistor means to receive the input signal; and means for reducing the capacitive current of said first transistor means.

6. A circuit according to claim 5 wherein said reducing means comprises third bipolar transistor means coupled across said second transistor means and second current source means coupled to the base of the third transistor means for selectively turning said third transistor means on when said first and second transistor means are off, thereby reducing the voltage on said first transistor means.

7. A circuit according to claim 6 further comprising first and second switch means coupled to said first and second current sources, respectively, and responsive to a control signal for selectively holding a voltage on said capacitor means representative of the input signal.

8. A circuit according to claim 7 wherein the input signal is a differential input signal, said circuit further comprising complementary components for generating a differential output signal.

9. A sample and hold circuit comprising:
a pair of input terminals for receiving a differential input signal;
a pair of output terminals for transmitting a differential ouptut signal;
a control signal generator for generating a pair of complementary control signals having a first state during which the voltage of the input signal existing when the control signal assumes the first state is held on the output terminals;
a first and second capacitor means coupled together and to said output terminals for storing respective complementary voltages on said output terminals;
first and second pairs of double emitter follower bipolar transistor pairs, each coupled between one of said input terminals and a corresponding one of said capacitor means, the base of one of said transistors in each of said transistor pairs being coupled to a respective one of said input terminals, the emitter of the other one of said transistors in each of said transistor pairs being coupled to a respective one of said capacitor means;
fifth and sixth bipolar transistors, each coupled in parallel, respectively with said one transistor of said first and second transistor pairs;
separate current source means coupled to the junction between said first and second capacitor means, to said one transistor of each of said pairs of transistors, and to said other transistors of each of said pairs of transistors; and
separate switch means posed in series with each of the respective current source means associated with said junction between said first and second capacitor means, and said other transistor of each of said pairs of transistors, said switch means each comprising a bipolar transistor, and said switch means associated with said other of said transistor pairs being coupled to receive respective ones of said complementary control signals, and said switch means associated with the junction between said capacitor means being coupled to receive a corresponding one of the control signals such that the voltage on said capacitor means tracks the input signal when the control signal is in a state other than the first state, and the voltage across both of said capacitor means is held at the voltage existing when the control signal changes to the first state while the control signal is in the first state.

* * * * *